United States Patent [19]

Seidensticker et al.

[11] Patent Number: 5,229,082
[45] Date of Patent: Jul. 20, 1993

[54] MELT REPLENISHMENT SYSTEM FOR DENDRITIC WEB GROWTH

[75] Inventors: Raymond G. Seidensticker, Forest Hills; Richard J. Ravas, Penn Twp., Westmoreland County; George V. B. Hall, Bethel Park; James P. McHugh, Wilkins Twp., Allegheny County; Frank L. Przywarty, Jefferson Boro; Lynd R. McCormick, Union Twp., Washington County, all of Pa.

[73] Assignee: Westinghouse Electric Corp., Pittsburgh, Pa.

[21] Appl. No.: 749,503

[22] Filed: Aug. 16, 1991

Related U.S. Application Data

[63] Continuation of Ser. No. 470,000, Jan. 25, 1990, abandoned.

[51] Int. Cl.$^5$ ............................................. C30B 15/02
[52] U.S. Cl. ................................ 422/249; 422/106; 156/601; 156/617.1; 156/626.1; 156/DIG. 88
[58] Field of Search .............. 422/249, 106; 156/601, 156/605, 617.1, 620.1, DIG. 88; 222/56, 330, 482, 485

[56] References Cited

U.S. PATENT DOCUMENTS

| | | | |
|---|---|---|---|
| 2,893,847 | 7/1959 | Schweickert et al. | 422/249 |
| 3,960,503 | 6/1976 | Rice | 156/DIG. 93 |
| 4,036,595 | 7/1977 | Lorenzini et al. | 156/617.1 |
| 4,039,062 | 8/1977 | Carre et al. | 222/485 |
| 4,248,539 | 2/1981 | Glocker | 222/459 |
| 4,282,184 | 8/1981 | Fiegl et al. | 422/106 |
| 4,698,120 | 11/1987 | Higginbotham | 156/620.1 |
| 4,762,687 | 8/1988 | Belouet et al. | 156/601 |
| 4,861,416 | 8/1989 | Morrison | 156/617.1 |

FOREIGN PATENT DOCUMENTS

| | | | |
|---|---|---|---|
| 69821 | 1/1983 | European Pat. Off. | 156/DIG. 88 |
| 62-207799 | 9/1987 | Japan | 422/249 |

OTHER PUBLICATIONS

Duncan "Automatic Control of Silicon Melt Level", NASA Technical Briefs, (Spring 1981) p. 94.

Primary Examiner—Robert Kunemund
Attorney, Agent, or Firm—J. C. Valentine

[57] ABSTRACT

A melt replenishment system for dendritic web growth having a pellet feed arrangement, which distributes equal amounts of feed material to a pair of feed tubes in communication with opposite ends of a crucible to maintain a melt pool at a constant level and a cover gas system, which keeps the feed tubes flowing and helps maintain thermal consistency within the melt.

16 Claims, 3 Drawing Sheets

FIG. I.

MELT REPLENISHMENT SYSTEM FOR DENDRITIC WEB GROWTH

This application is a continuation of application Ser. No. 07/470,000 filed Jan. 25, 1990, now abandoned.

CROSS REFERENCE TO RELATED APPLICATIONS

This application is related to a co-pending application entitled "Improved Barrier Design for Crucibles for Silicon Dendritic Web Growth" filed Dec. 1, 1987 and assigned Ser. No. 140071, now U.S. Pat. No. 4,919,901.

BACKGROUND OF THE INVENTION

The invention relates to a system for making dendritic silicon webs and more particularly to a system for maintaining the molten pool from which the dendritic web is pulled at a constant level by adding material at the desired controlled rate.

Commercialization of the dendritic web growth process requires replenishment of the melt pool to produce long ribbons of high quality. Although crystals as long as 7 and 8 meters can be grown without replenishment during growth, the time required for replenishment between crystals adversely affects the output and efficiency of the process. Commercial viability of a process for dendritic web silicon for photovoltaic applications requires essentially continuous growth of the ribbons. Thus, the silicon melts from which the ribbons crystals are grown must be continuously replenished not only to replace the material removed from the melt, but also to maintain the thermal conditions in the growth system. The position of the melt surface with respect to the lid that covers the crucible especially affects the thermal conditions in the vicinity of the juncture of the dendritic web and the molten pool.

U.S. Pat. No. 4,389,377 describes a melt system including a susceptor-crucible assembly having improved gradient control when melt replenishment is used during dendritic web growth. The improvement lies in the formation of a thermal barrier in the base of the receptor which is in the form of a vertical slot in the region of the susceptor underlying the crucible at the location of a growth compartment and a melt replenishment compartment. The result achieved is a step change in temperature gradient in the melt thereby providing a more uniform temperature in the growth compartment from which the dendritic web is drawn.

SUMMARY OF THE INVENTION

Among the objects of the invention may be noted the provision of a replenishment system which controls the flow of pellets to the melt pool to maintain a generally constant melt level.

In general, a melt replenishment system for dendritic web growth in an elongated crucible having a central portion from which a dendritic web is pulled from a molten pool of material, when made in accordance with this invention, comprises a pair of material feed portions one disposed on each end of the crucible through which replenishment feed material is supplied to the pool; an enclosed feed chamber having a reservoir for pellets of feed material; means for controlling the rate at which the pellets are fed from the feed chamber; a pellet flow splitter which divides the pellets into essentially equal amounts and a pair of conduits each of which receives an essentially equal amount of the pellets from said flow splitter and directs the pellets to the feed portions on each end of the crucible; the pellet rate control means generally controlling the pellet flow at a rate which equals the rate the material is being pulled from the pool in the central portion of the crucible in the form of a dendritic web and means for supplying cover gas to the system to prevent contamination of the pellets and the buildup of oxides and material dust in the conduits to insure free flow of the pellets in the conduits.

BRIEF DESCRIPTION OF THE DRAWINGS

The invention as set forth in the claims will become more apparent by reading the following detailed description in conjunction with the accompanying drawings, wherein like reference numerals refer to like parts through the drawings and in which:

DESCRIPTION OF THE PREFERRED EMBODIMENT

Figure 1:
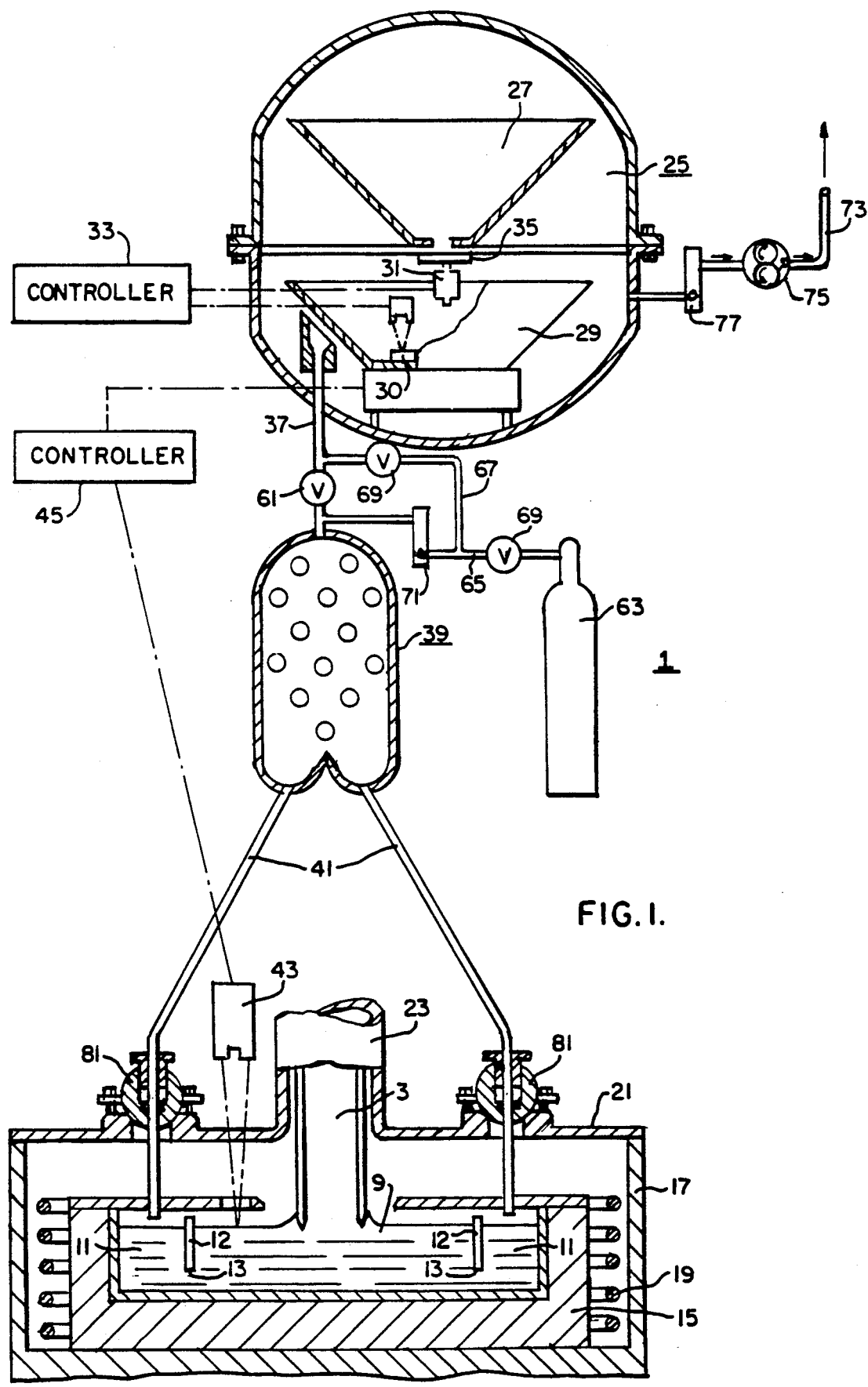
FIG. 1 is a schematic view of a melt replenishment system made in accordance with this invention.
Figure 2:
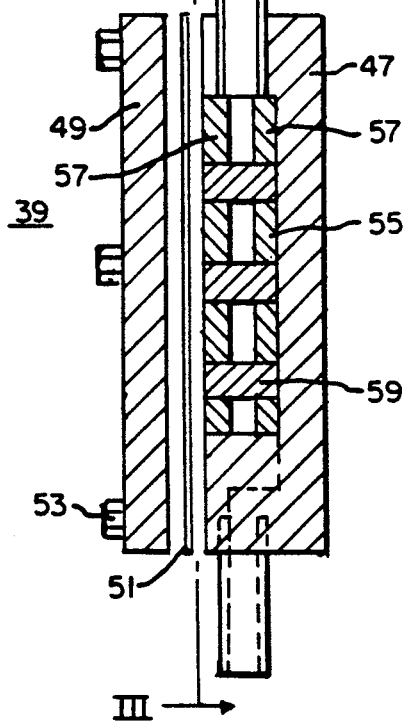
FIG. 2 is a sectional view of a pellet splitter.
Figure 3:
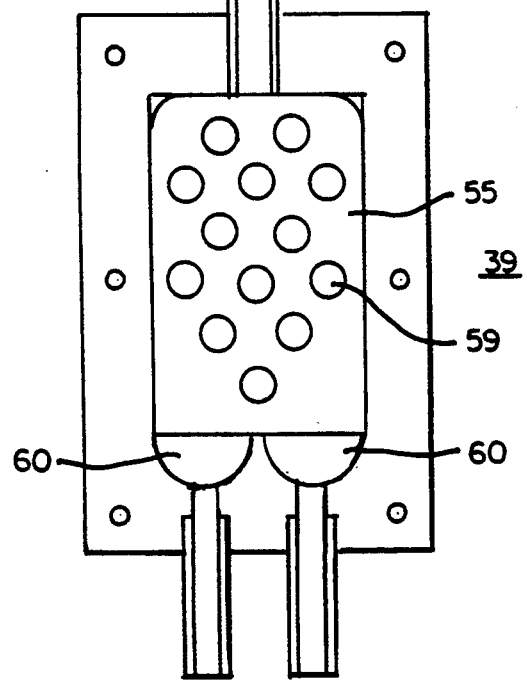
FIG. 3 is a sectional view taken on line III—III of FIG. 2.
Figure 5:
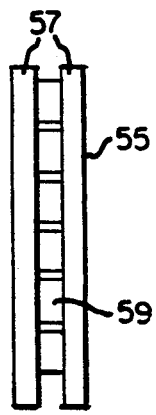
FIG. 5 is a sectional view taken on line V—V of FIG. 4.
Figure 4:
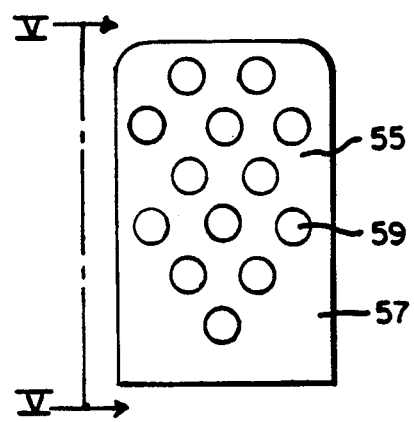
FIG. 4 is an elevational view of a quincunx assembly.

Referring now to the drawings in detail and in particular to FIG. 1 there is shown a schematic view of a melt replenishment system 1 for growing a silicon dendritic web 3. The dendritic web is pulled form a molten pool 5 of silicon maintained in a crucible 7. The crucible 7 is normally made of quartz and is an elongated dish with a central portion 9 from which the dendritic web is pulled and a pair of feed portions 11 on opposite ends separated by walls 12, which have openings 13 that permit the flow of replenishment material to the central portion 9 of the crucible 7. The crucible 7 is disposed in a susceptor 15, which is placed in an induction furnace 17. The furnace 17 has an induction coil 19 which supply energy to maintain the high temperature needed to preserve the melt and includes a lid 21 with a chimney 23 through which the web 3 is pulled and an inert gas supply (not show) which provides a cover gas to prevent contamination of the molten pool 5 and the newly formed web 3.

The replenishment system 1 comprises an enclosed feed chamber 25 having a reservoir 27 for pellets of replenishment feed material and a pellet feeder 29 disposed therein. The pellet feeder 29 is made of stainless steel or other corrosion resistant material and coated with Teflon, nylon or epoxy to prevent contamination of the feed pellets. The pellet feeder 25 is a vibrator type feeder in which the feed rate varies in response to vibration amplitude and level of pellets maintained therein. To provide accurate control of the pellet feed rate, the pellet level is maintained at a generally constant level by placing a mirror 30 in the pellet feeder and using a light source and light sensor 31 to send a signal to a controller 33 to operate a rotating valve 35, which allows pellets to drop into the vibratory feeder 29 to maintain a generally constant level therein. The rotary valve 35 can be controlled accurately enough to maintain the molten pool 5 at a constant level. The vibratory feeder 29 accurately controls the amount of pellets fed into a feed tube or feed conduit 37, which directs the pellets to a flow splitter 39, which separates the pellets into two equal streams. An equal number of pellets are fed from the flow splitter 39 to each feed conduit of a pair of feed tubes or conduits 41, which direct the pellets to the feed compartments 11 on opposite ends of the crucible 7 to maintain the level of the melt essentially constant. To obtain the accurately controlled feed rate necessary to maintain an essentially constant melt level, a laser level sensor 43 sends a signal to a controller 45 which operates the vibratory feeder to increase or decrease the pellet feed rate depending on the signal from the level sensor 43 as to whether the level has respectively decreased or increased.

The flow splitter 39, as shown in FIGS. 2 through 5, comprises an enclosure 47, which has a lid 49 and a peripheral seal 51 made gas tight by a plurality of cap screws 53. A Quincunx Assembly 55 is disposed within the enclosure 47 and comprises a pair of spaced apart plates 57 with a plurality of pins 59 disposed on a triangular pitch, perpendicular to the spaced apart plates 57, and in the space therebetween. The conduit 37 feeds replenishment pellets to the upper central portion of the Quincunx Assembly 55 and the pair of conduits 41 are in communication with a pair of arcuate cavities 60 disposed in the lower end of the Quincunx Assembly 55 and are disposed to receive and equal number of replenishment pellets from the stream feed to the flow splitter 39 via the conduit 37.

A valve 61 is disposed in the conduit 37 to manually shut off the conduit 37. Inert gas is supplied to the conduit 37 on each side of the valve 61 from a supply tank 63 via supply lines 65 and 67, each of which has a shut-off valve 69 disposed therein. The line 65 also has a flow meter and manual flow control valve 71 disposed therein. An exhaust line 73 is connected in fluid communication with the feed chamber 25 and has a vacuum pump 75 and flow meter and manual flow control valve 77 disposed therein.

Figure 6:
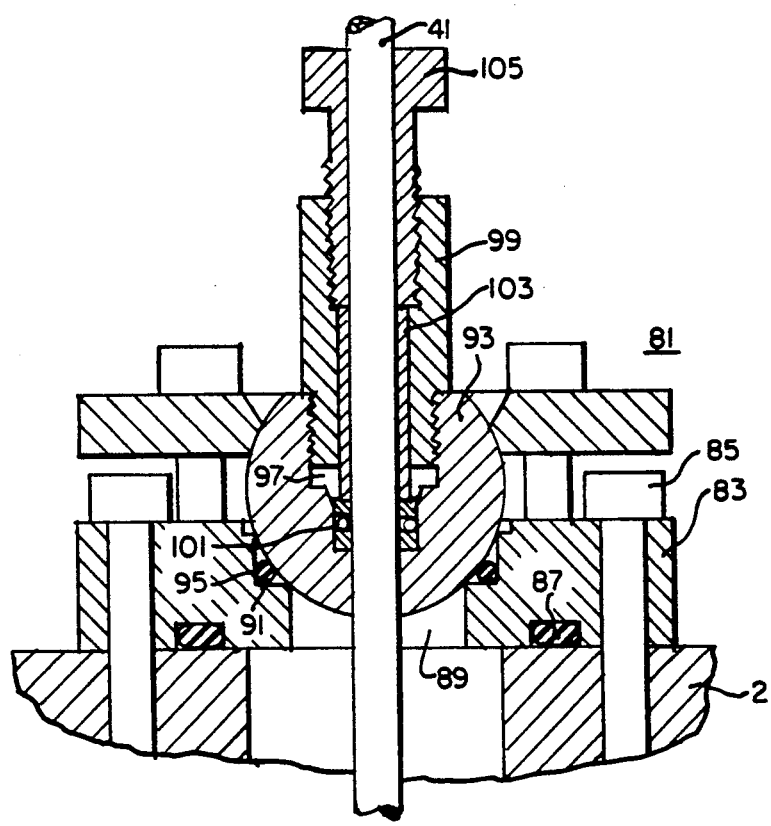
FIG. 6 is a sectional view of a feed tube seal assembly.

As shown in FIG. 6, the feed tubes or conduits 41 each pass through a gas tight seal 81 when penetrating the furnace cover or lid 21. The gas tight seals comprise a bottom flange 83 fastened to the lid 21 by cap screws 85 and having a O-ring seal 87 disposed between the bottom flange 83 and the lid 21. The bottom flange also has a central opening 89 and a seat 91 for a ball 93 with a O-ring seal 95 disposed between the ball 93 and seat 91. The ball 93 has a central opening 97 and a seal arrangement for the conduit 41, which passes therethrough. The seal arrangement comprises a tubular member 99 threaded into the opening of the ball 93, an O-ring 101 disposed between the ball 93 and the conduit 41, a sleeve 103 disposed between the tubular member 99 and the conduit 41 and a gland nut 105 threaded into the tubular member 99 for urging the sleeve 103 against the O-ring 101 to effectuate a seal between the ball 93 and the conduit 41.

The operation of the melt replenishment system 1 is as follows: the pellet reservoir 27 is disposed in the enclosed feed chamber 25 and the pellet reservoir 27 contains an abundant supply of silicon pellets, which are fed via a rotating valve 35 to a vibratory feeder 29. To obtain an accurately controlled flow rate from the vibratory feeder 29, which is responsive to the rate of vibration, the level of pellets in the vibratory feeder 29 is maintained at a generally constant level by a controller 33 which responds to a signal form a light source and sensor 31. The light source shines on a mirror 30 which reflects the light back to the sensor when the mirror 30 is not covered with pellets to operate the rotating valve 35 to maintain a generally constant level of pellets covering the mirror 30.

Figure 7:
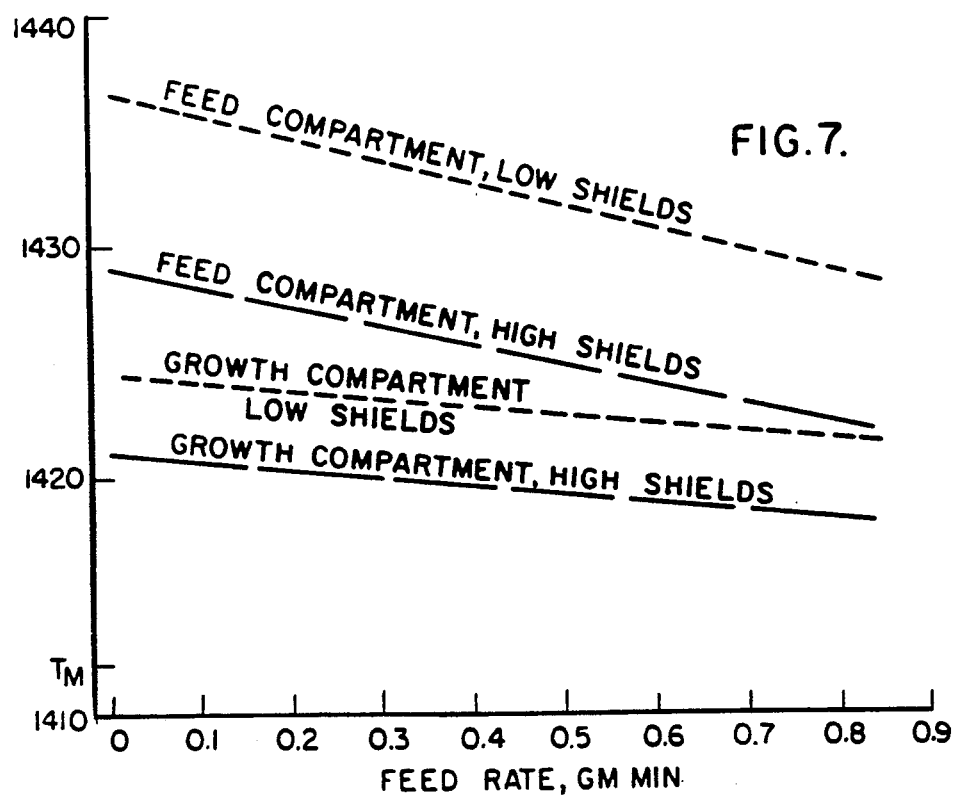
FIG. 7 shows melt temperature as a function of feed rate.

The laser sensor 43 is directed on the surface of the molten pool 5 in the crucible 7, sending a signal to the controller 47 when the level varies to increase or decrease the flow from the vibrator feeder 29 to accurately maintain the level of the molten pool 5. The pellets being supplied by the vibratory feeder 29 drop into the feed tube or conduit 37 and are directed to a flow splitter, which divides the pellets into two equal streams. The pair of feed tube or conduits 41 each receive one of the two streams of pellets and direct an equal number of the pellets to the feed compartments 11 on opposite ends of the crucible 7 to maintain the melt level within the crucible 7 constant. As shown in FIG. 7, adding the pellets to both ends of the crucible 7 reduces the feed rate at each end and maintains a higher and more constant temperature in the growth compartment 9 to produce improved dendritic web 3. Cover gas is supplied to the feed tubes or conduits 37 and 41 from the gas supply tank 63 through the flow meter with a manual flow control valve 71 to blanket the entire melt replenishment system 1 and a vacuum pump 75 and flow meter with a manual control valve 77 control the exhaust from the melt replenishment system 1 to maintain a slight downward flow in the pair of feed tubes or conduits 41 supplying pellets to the crucible 7 to prevent them from clogging with silicon dioxide and to keep gas flowing upwardly through the feed tube or conduit 37 to prevent back diffusion of any air or water vapor that might enter the feed chamber and to blow out any feed material dust entering the feed conduits 41. Typically a flow rate of three cubic centimeters per second is sufficient. One cubic centimeter flowing up the conduit 37 and one cubic centimeter per second flowing down each of the conduits 41. It has been found that a gas flow as low as 0.7 cubic centimeters per second in each of the conduits 41 is sufficient to keep the feed conduits 41 clear; without the gas flow the tubes would become clogged with silicon oxides in as short a time as a half an hour. The supply line 67 is disposed in fluid communication with the conduit 37, between the shut off valve 61 and the feed chamber 25 and is operated to provide a large purge flow to clear the feed chamber 25 should the need arise to open it during furnace operation.

The flow splitter 29 normally known as a Quincux Splitter divides the pellets into two equal streams. The necessity of splitting the feed flow is twofold. First, the double ended feeding maintains the requisite thermal system in the crystal growth compartment 9. If the thermal load of melting the pellets is located at one end of the crucible 7, the temperature distribution in the liquid silicon is skewed and problems can occur with the growing dendritic web 3. Such asymmetry can be compensated for through the use of movable radiation shields at the end of the susceptor 15 or by changes in the position of the induction coil 19, however the system response is slow and changes in feed rate require continual changes in these thermal adjustments. Double ended feeding, as hereby provided, negates this problem. A second and related reason is that the double end feeding puts only half of the thermal load at each end of the crucible 7. Typical measurements of the melt temperature in the feed compartment 9 are shown in FIG.

7. The smaller the feed rate in each compartment 11, the smaller the thermal perturbation of the system. With the sensitive thermal system required for dendritic web growth, the less perturbation the better.

The conduits 37 and 41, which feed the pellets may be made of a metal, such as molybdenum, or a ceramic, such as a high purity alumina. With metal conduits you have the problem of the conduit alloying with the pellets, which contaminates the melt and clogs the conduit. On the other hand, the ceramic conduits 37 and 41 do not react with the pellets, but are readily clogged with oxide if the gas flow described herein is not maintained. Positioning the conduits 41 with respect to the molten pool 5 is also critical to the growth so that the adjustable seals 81 are important to proper operation of the replenishment system 1.

The melt replenishment system 1, herein described, advantageously provides a precise feed rate of pellets, which is split into two essentially equal streams so that equal double ended feeding is possible, thus maintaining thermal symmetry in the crucible 7 and reducing the localized thermal impact of adding feed material; provides a cover gas system that prevents atmospheric contamination, removes feed dust from the system and keeps the feed tubes free of oxide buildup; and provides the integration of the diverse elements into a system that simultaneously addresses the thermal, atmospheric purity, and operational requirements of replenishing a silicon dendritic web growth system.

While the preferred embodiments described herein set forth the best mode to practice this invention presently contemplated by the inventors, numerous modifications and adaptations of this invention will be apparent to others skilled in the art. Therefore, the embodiments are to be considered as illustrative and exemplary and it is understood that the claims are intended to cover such modifications and adaptations as they are considered to be within the spirit and scope of this invention.

What is claimed is:

1. An enclosed melt replenishing system for dendritic web growth in an elongated crucible having a central portion from which a dendritic web is pulled from a molten pool of material, said system comprising a pair of material feed portions one disposed on each end of the crucible through which replenishment feed material is supplied to the pool; an enclosed feed chamber having a reservoir for pellets of said feed material; means for controlling the rate at which the pellets are fed from said feed chamber in a single stream comprising two pellet feeders disposed in series, the first feeder feeding the second feeder to maximize the accuracy of the second feeder in controlling the flow rate of the single stream of pellets; a pellet flow splitter which divides the single stream of pellets into essentially equal amounts; a pair of conduits each of which receives an essentially equal amount of the pellets from said flow splitter and directs the pellets to the feed portions on each end of the crucible; the pellet rate control means generally controlling the pellet flow at a rate which equals the rate the material is being pulled from the pool in the central portion of the crucible in the form of a dendritic web and means for supplying low pressure cover gas to the system to prevent contamination of the pellets and the buildup of oxides and means for continuously purging the pellets being supplied by said replenishment system to remove material dust and contamination in the conduits and replenishment system to insure free flow of the pellets in the conduits and minimal thermal disturbance to the pool.

2. A system as set forth in claim 1, wherein the means for controlling the rate at which pellets are fed comprises a vibratory feeder which varies the feed rate in response to the level of pellets in the feeder and the input power to the feeder.

3. A system as set forth in claim 2, wherein the means for controlling the rate at which pellets are fed comprise means for keeping the level of pellets in the vibratory feeder at a generally constant level.

4. A system as set forth in claim 3, wherein the means for keeping the level of pellets in the vibratory feeder at a generally constant level comprises a valve on the reservoir which is opened and closed by a controller responsive to the level of pellets in the vibratory feeder.

5. A system as set forth in claim 4, wherein the controller responsive to the level of pellets in the vibratory feeder comprises a mirror disposed to cooperate with a light source and sensor to send a signal to close the valve on the reservoir when pellets obscure the light path between the mirror and light source and sensor and open the valve when the light path is unobscured to maintain a generally constant level of pellets in the vibratory feeder.

6. A system as set forth in claim 5, wherein the vibratory feeder is coated with a protective coating to protect the pellets from contamination.

7. A system as set forth in claim 6, wherein the protective coating is a material such as teflon, nylon or epoxy.

8. A system as set forth in claim 2, wherein the vibratory feeder is disposed in the enclosure.

9. A system as set forth in claim 6, wherein the vibratory feeder is disposed in the enclosure.

10. A system as set forth in claim 9, wherein the pellet flow splitter is a quincunx.

11. A system as set forth in claim 1, wherein the pellet flow splitter is a quincunx.

12. A system as set forth in claim 9, wherein the means for controlling the rate at which the pellets are fed from said feed chamber is responsive to the level of molten material in the crucible to control the vibratory feeder to maintain the level generally constant.

13. A system as set forth in claim 1, wherein the means for supplying cover gas to the system comprises a tank for supplying inert gas in fluid communication with the system and the means for purging the pellet supply comprises a vacuum pump in fluid communication with the enclosure to remove gas therefrom, maintain a purging gas flow rate through the pellet supply and provide a low pressure within the system.

14. A system as set forth in claim 10, wherein the means for supplying cover gas to the system comprises a tank for supplying inert gas in fluid communication with the system and the means for purging the pellet supply comprises a vacuum pump in fluid communication with the enclosure to remove gas therefrom, maintain a purging gas flow rate through the pellet supply and provide a flow pressure within the system.

15. A system as set forth in claim 14, wherein the means for supplying cover gas further comprises a valve separating the feed chamber from the flow splitter and the cover gas system supplying gas to both sides of the valve when it is closed to facilitate purging of the feed chamber and for keeping the pair of conduits free of oxides.

16. A system as set forth in claim 14, and further comprising a seal where the conduits enter the furnace.

* * * * *